United States Patent
Kobayashi et al.

(10) Patent No.: US 10,333,303 B2
(45) Date of Patent: Jun. 25, 2019

(54) POWER SUPPLY DEVICE AND METHOD OF CONTROLLING POWER SUPPLY DEVICE

(71) Applicant: SHINDENGEN ELECTRIC MANUFACTURING CO., LTD., Chiyoda-ku (JP)

(72) Inventors: Yoshinori Kobayashi, Hanno (JP); Kazuo Yamashita, Hanno (JP)

(73) Assignee: SHINDENGEN ELECTRIC MANUFACTURING CO., LTD., Chiyoda-ku (JP)

( * ) Notice: Subject to any disclaimer, the term of this patent is extended or adjusted under 35 U.S.C. 154(b) by 0 days.

(21) Appl. No.: 15/766,430

(22) PCT Filed: Aug. 4, 2017

(86) PCT No.: PCT/JP2017/028487
§ 371 (c)(1),
(2) Date: Apr. 6, 2018

(87) PCT Pub. No.: WO2019/026295
PCT Pub. Date: Feb. 7, 2019

(65) Prior Publication Data
US 2019/0089157 A1    Mar. 21, 2019

(51) Int. Cl.
*H02M 3/158*    (2006.01)
*H02J 3/10*    (2006.01)
(Continued)

(52) U.S. Cl.
CPC .......... *H02J 3/10* (2013.01); *G01R 19/16528* (2013.01); *H03K 19/01806* (2013.01); *G05F 1/44* (2013.01)

(58) Field of Classification Search
CPC ..... G05F 1/00; G05F 1/10; G05F 1/12; G05F 1/45; G05F 1/46; G05F 1/445;
(Continued)

(56) References Cited

U.S. PATENT DOCUMENTS

2010/0253268 A1*  10/2010  Marvelly ............ H02P 6/14
318/400.26

FOREIGN PATENT DOCUMENTS

JP      61-49614 A      3/1986
JP   2004-304924 A    10/2004
(Continued)

OTHER PUBLICATIONS

International Search Report dated Sep. 19, 2017, in PCT/JP2017/028487, filed Aug. 4, 2017, (with English translation of categories of cited documents).

*Primary Examiner* — Jue Zhang
*Assistant Examiner* — Afework S Demisse
(74) *Attorney, Agent, or Firm* — Oblon, McClelland, Maier & Neustadt, L.L.P.

(57) ABSTRACT

A power supply device includes an output circuit configured to be supplied with electric power from a power supply, and to output a current, a driving circuit configured to control an output operation of the output circuit to output a current, an overcurrent detection circuit configured to output a detection signal to a first node when detecting an overcurrent in the output circuit, an off-state fixing circuit configured to output an off-state fixing signal to the driving circuit for performing a forcible suspension of the output operation of the output circuit based on a detection signal inputted to the first node, regardless of whether a control signal is outputted, and a control unit configured to receive the detection signal and to output the control signal for controlling the output operation to the driving circuit in order to cause the driving circuit to control the output operation.

11 Claims, 10 Drawing Sheets

(51) Int. Cl.
*G01R 19/165* (2006.01)
*H03K 19/018* (2006.01)
*G05F 1/44* (2006.01)

(58) Field of Classification Search
CPC ........... G05F 1/455; H02M 3/10; H02M 3/13;
H02M 3/125; H02M 3/135; H02M 3/145;
H02M 3/155; H02M 3/156; H02M 3/158;
H02M 3/1588; H02J 3/10
See application file for complete search history.

(56) References Cited

FOREIGN PATENT DOCUMENTS

| | | |
|---|---|---|
| JP | 2007-252165 A | 9/2007 |
| JP | 2008-118834 A | 5/2008 |
| JP | 2010-246374 A | 10/2010 |
| JP | 2013-247821 A | 12/2013 |
| JP | 3193936 U | 10/2014 |
| JP | 2015-106980 A | 6/2015 |

* cited by examiner

POWER SUPPLY DEVICE AND METHOD OF CONTROLLING POWER SUPPLY DEVICE

TECHNICAL FIELD

The present invention relates to a power supply device, and a method of controlling a power supply device.

BACKGROUND ART

If, in a conventional power supply device 100A (FIG. 9) that controls output waveforms by means of a control unit CPU, an overcurrent detection circuit XA detects an overcurrent in an output circuit OCA (for example, a bridge circuit) based on an overcurrent threshold value THO, timing (and period) for turning off the output circuit OCA (suspending an output of a drive signal DS from a driver circuit DCA (fixing the drive signal DCA at a "Low" level)) is determined by a time constant circuit TA, which is hardware, using a CR time constant (FIG. 10) (for example, see Patent Document 1).

The conventional power supply device 100A therefore is likely to be affected by temperature and accuracy.

If the control unit CPU controls all operations for turning on or off the output circuit OCA based on overcurrent detection results in the conventional power supply device 100A, a problem arises in that as the switching frequency becomes higher, the processing load of the control unit CPU increases.

PRIOR ART DOCUMENT

Patent Document

[Patent Document 1] JP 2015-106980 A

DISCLOSURE OF THE INVENTION

Problem to be Solved by the Invention

As described above, if the control unit CPU controls all operations for turning on or off the output circuit OCA based on overcurrent detection results in the conventional power supply device 100A, a problem arises in that as the switching frequency becomes higher, the processing load of the control unit CPU increases.

Under the circumstance, it is an object of the present invention to provide a power supply device in which, when an overcurrent in the output circuit is detected, a period for turning off the output circuit is counted by a CPU, and other processes are performed by hardware to reduce the processing load of the control unit even if the switching frequency is high.

Solution to Problem

A power supply device according to an embodiment in an aspect of the present invention includes:

an output circuit configured to be supplied with electric power from a power supply, and to output a current;

a driving circuit configured to control an output operation of the output circuit for outputting the current;

an overcurrent detection circuit configured to output a detection signal to a first node when detecting an overcurrent in the output circuit;

an off-state fixing circuit configured to output, based on the detection signal inputted to the first node, an off-state fixing signal for performing a forcible suspension of the output operation of the output circuit from an output node to the driving circuit, regardless of whether a control signal is outputted; and a control unit configured to receive the detection signal, and to output the control signal for controlling the output operation of the output circuit to the driving circuit for controlling the output operation of the output circuit by means of the driving circuit, wherein, in response to the off-state fixing signal, the driving circuit performs the forcible suspension of the output operation of the output circuit regardless of whether the control signal is outputted, wherein the control unit outputs a cancellation signal for cancelling the forcible suspension of the output operation of the output circuit to the off-state fixing circuit after an off period passes from time when the detection signal is inputted, and wherein, in response to the cancellation signal, the off-state fixing circuit stops outputting the off-state fixing signal to cause the driving circuit to return to a normal operation for controlling the output operation of the output circuit based on the control signal.

In the power supply device,
the off-state fixing circuit:
outputs the detection signal inputted to the first node to the driving circuit as the off-state fixing signal; and
thereafter, controls a potential at the first node to stop outputting the off-state fixing signal in response to the cancellation signal inputted.

In the power supply device,
the control unit:
makes a feedback of the cancellation signal that is outputted, and detects whether there is an abnormal condition in the cancellation signal in the feedback; and
controls the driving circuit by means of the control signal to stop the output operation of the output circuit when detecting the abnormal condition in the cancellation signal.

In the power supply device,
the overcurrent detection circuit does not output the detection signal to the first node when no overcurrent caused by the output operation of the output circuit Is detected.

In the power supply device,
the control unit outputs the control signal for controlling the output operation of the output circuit to the driving circuit in order to control the output operation of the output circuit by means of the driving circuit when the detection signal is not inputted after the cancellation signal is outputted.

In the power supply device,
the driving circuit includes:
a logic circuit configured to output a logic signal obtained by performing calculation of the control signal and a signal that is based on a potential at the first node; and
a driver configured to control, based on the logic signal, the output operation for outputting the current from the output circuit.

In the power supply device,
the output circuit is a bridge circuit configured to control and output the electric power supplied from the power supply.

In the power supply device,
the bridge circuit includes:
a first output transistor having an end that is connected to the power supply, and another end that is connected to a first output terminal;

a second output transistor having an end that is connected to the power supply, and another end that is connected to a second output terminal;

a third output transistor having an end that is connected to the first output terminal, and another end that is connected to a fixed potential;

a fourth output transistor having an end that is connected to the second output terminal, and another end that is connected to the fixed potential;

a first detection resistor having an end that is connected to the other end of the third output transistor, and another end that is connected to the fixed potential; and a second detection resistor having an end that is connected to the other end of the fourth output transistor, and another end that Is connected to the fixed potential, wherein the overcurrent detection circuit detects currents flowing through the first detection resistor and the second detection resistor to detect the overcurrent of a current outputted from the bridge circuit, and outputs the detection signal depending on a detection result, and wherein the driving circuit controls an output operation of the bridge circuit to output electric power by controlling operations of the first to fourth output transistors based on the control signal during the normal operation.

In the power supply device,
the control unit sets the off period, during which the output operation of the output circuit is forcibly suspended, by means of software.

In the power supply device,
the output node is connected to the first node,
the off-state fixing circuit includes:
a first PNP-type bipolar transistor having an emitter that is connected to the power supply;
a first control resistor having an end that is connected to a collector of the first PNP-type bipolar transistor;
a first NPN-type bipolar transistor having a collector that is connected to another end of the first control resistor, an emitter that is connected to a fixed potential, and a base, to which the cancellation signal is inputted from the control unit;
a second control resistor having an end that is connected to the power supply, and another end that is connected to a base of the first PNP-type bipolar transistor;
a third control resistor having an end that is connected to the other end of the second control resistor, and another end that is connected to the first node; and
a second NPN-type bipolar transistor having a collector that is connected to the other end of the third control resistor, an emitter that is connected to the fixed potential, and a base that is connected to the other end of the first control resistor, and
the off-state fixing circuit outputs a signal that is based on the potential at the first node to the driving circuit as the off-state fixing signal in response to the detection signal outputted from the overcurrent detection circuit, and stops outputting the off-state fixing signal to the driving circuit in response to the cancellation signal outputted from the control unit.

In the power supply device,
the overcurrent detection circuit outputs the detection signal when the current outputted from the output circuit is equal to or greater than an overcurrent threshold value that is predefined, and does not output the detection signal when the current outputted from the output circuit is less than the overcurrent threshold value.

In the power supply device,
the driving circuit:

performs suspension of the operations of the first to fourth output transistors in response to the off-state fixing signal outputted from the off-state fixing circuit based on the detection signal at the first node when the overcurrent Is detected by the overcurrent detection circuit;

then, cancels the suspension of the operations of the first to fourth output transistors when the output of the off-state fixing signal based on the cancellation signal from the off-state fixing circuit is stopped; and then, controls the operations of the first to fourth output transistors based on the control signal.

In the power supply device,
the output node is connected to the first node,
the off-state fixing circuit includes:
a first control resistor having an end that is connected to the power supply, and another end that is connected to the first node;
a second control resistor having an end that is connected to the power supply;
a capacitor having an end that is connected to the first node, and another end that Is connected to a fixed potential;
a PNP-type bipolar transistor having an emitter that is connected to the first node, another end that is connected to the fixed potential, and a base that is connected to another end of the second control resistor; and
an NPN-type bipolar transistor having a collector that is connected to the other end of the second control resistor, an emitter that is connected to the fixed potential, and a base to which the cancellation signal from the control unit is Inputted,
the output node is connected to the first node, and
the off-state fixing circuit outputs a signal that is based on the potential at the first node to the driving circuit as the off-state fixing signal, in response to the detection signal outputted from the overcurrent detection circuit, and stops outputting the off-state fixing signal to the driving circuit in response to the cancellation signal outputted from the control unit.

In the power supply device,
the off-state fixing circuit includes:
a first control resistor having an end that is connected to the power supply, and another end that is connected to the output node;
a second control resistor having an end that is connected to the power supply;
a third control resistor having an end that is connected to another end of the second control resistor, and another end that is connected to the first node;
a first capacitor having an end that is connected to the other end of the first control resistor, and another end that is connected to a fixed potential;
a second capacitor having an end that is connected to the end of the second control resistor, and another end that is connected to the fixed potential;
a third capacitor having an end that is connected to the other end of the second control resistor, and another end that is connected to the fixed potential;
a fourth control resistor having an end that is connected to the other end of the second control resistor;
an NPN-type bipolar transistor having a collector that is connected to the other end of the second capacitor, an emitter that is connected to the fixed potential, and a base to which the cancellation signal from the control unit is inputted; and
a reset circuit having an end that is connected to the other end of the first control resistor, and another end that is connected to the fixed potential, the reset circuit being configured to electrically connect the end and the other end of the first capacitor to discharge the first capacitor when a potential at the other end of the second control resistor is less than a reset threshold value that is predefined, and to electrically disconnect the end and the other end of the first capacitor when the potential at the other end of the second control resistor is equal to or greater than the reset threshold value, and the off-state fixing circuit outputs a signal that Is based on the potential at the first node to the driving circuit as the off-state fixing signal in response to the detection signal outputted from the overcurrent detection circuit, and stops outputting the off-state fixing signal to the driving circuit in response to the cancellation signal outputted from the control unit.

A method of controlling a power supply device according to an embodiment in an aspect of the present Invention Is a method of controlling a power supply device including:

an output circuit configured to be supplied with electric power from a power supply, and to output a current;

a driving circuit configured to control an output operation of the output circuit for outputting the current;

an overcurrent detection circuit configured to output a detection signal to a first node when detecting an overcurrent in the output circuit;

an off-state fixing circuit configured to output, based on the detection signal inputted to the first node, an off-state fixing signal for performing a forcible suspension of the output operation of the output circuit from an output node to the driving circuit, regardless of whether a control signal Is outputted; and a control unit configured to receive the detection signal, and to output the control signal for controlling the output operation of the output circuit to the driving circuit for controlling the output operation of the output circuit by means of the driving circuit, the method comprising the steps of:

performing a forcible suspension of the output operation of the output circuit in response to the off-state fixing signal by means of the driving circuit, regardless of whether the control signal is outputted;

outputting, from the control unit, a cancellation signal for cancelling the forcible suspension of the output operation of the output circuit to the off-state fixing circuit after an off period passes from time when the detection signal is inputted, and in response to the cancellation signal, stopping, by the off-state fixing circuit, outputting the off-state fixing signal to cause the driving circuit to return to a normal operation for controlling the output operation of the output circuit based on the control signal.

Effects of the Invention

A power supply device according to an aspect of the present Invention Includes:

an output circuit configured to be supplied with electric power from a power supply, and to output a current;

a driving circuit configured to control an output operation of the output circuit for outputting the current;

an overcurrent detection circuit configured to output a detection signal to a first node when detecting an overcurrent in the output circuit;

an off-state fixing circuit configured to output, based on the detection signal inputted to the first node, an off-state fixing signal for performing a forcible suspension of the output operation of the output circuit to the driving circuit, regardless of whether a control signal is outputted; and a control unit CPU configured to receive the detection signal, and to output the control signal for controlling the output operation of the output circuit to the driving circuit for controlling the output operation of the output circuit by means of the driving circuit.

In response to the off-state fixing signal, the driving circuit performs the forcible suspension of the output operation of the output circuit regardless of whether the control signal is outputted, the control unit outputs a cancellation signal for cancelling the forcible suspension of the output operation of the output circuit to the off-state fixing circuit after an off period that is predetermined passes from time when the detection signal is inputted, and in response to the cancellation signal, the off-state fixing circuit stops outputting the off-state fixing signal to cause the driving circuit to return to a normal operation for controlling the output operation of the output circuit based on the control signal.

Thus, in power supply device according to the present invention, the output circuit is forcibly suspended based on a detection result of the overcurrent detection circuit, and is caused to return to a normal operation based on a cancellation signal that is outputted after an off period set by the control unit CPU passes.

Thus, the processing load of the control unit CPU may be reduced even if the switching frequency is high by counting, by the control unit CPU, the period during which the output circuit is turned off when an overcurrent is caused in the output circuit, and performing other processes by means of hardware.

Since the period during which the output circuit is suspended when the overcurrent is caused is set by the control unit CPU, the operation is not affected by the temperature and the accuracy, and the setting may be changed easily by a communication.

EMBODIMENTS FOR CARRYING OUT THE INVENTION

Embodiments of the present invention will now be described with reference to the accompanying drawings.

[First Embodiment]

Figure 1:
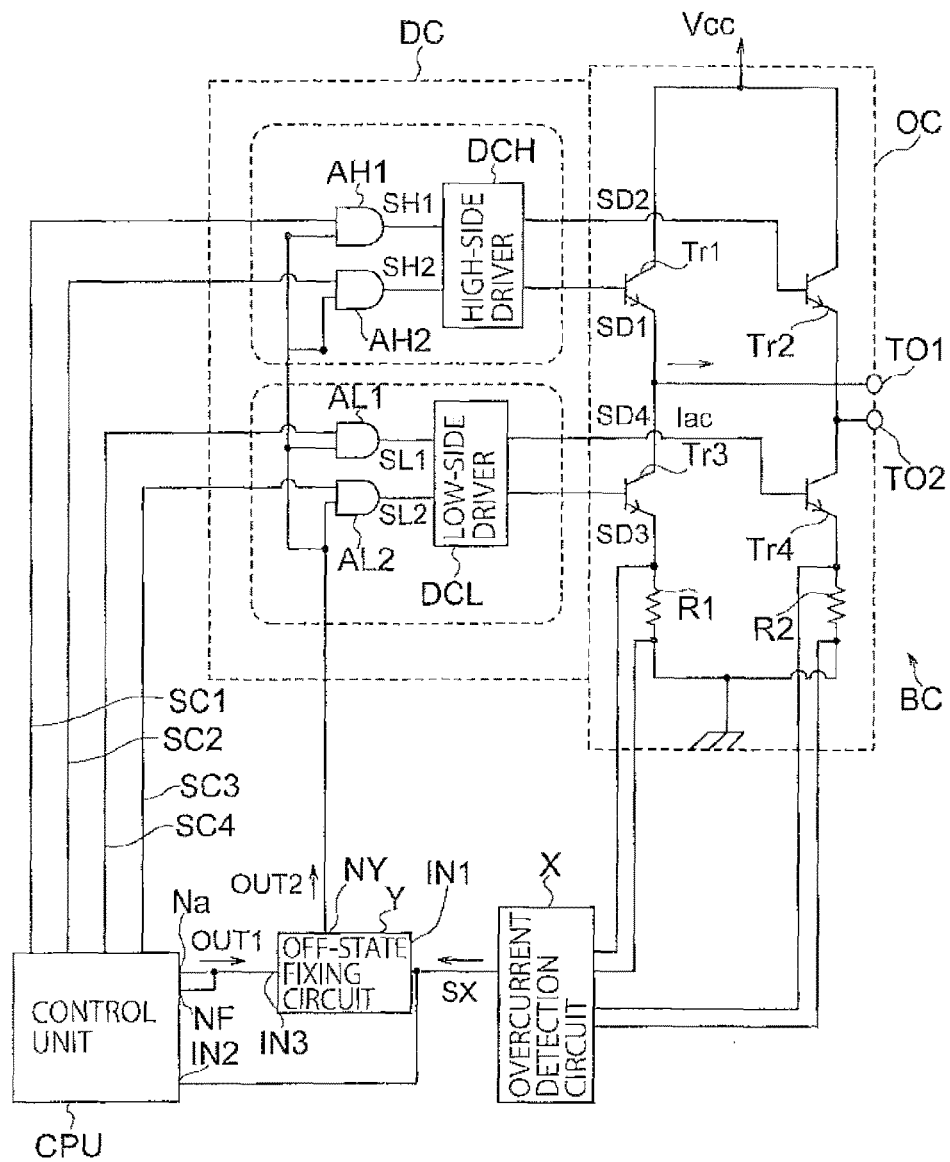
FIG. 1 is a diagram illustrating an example of a configuration of a power supply device 100 according to a first embodiment.
Figure 2:
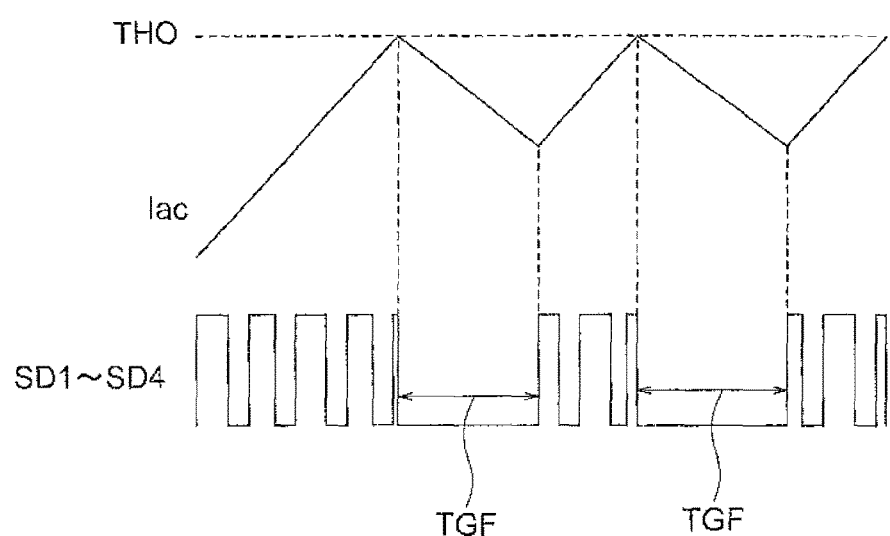
FIG. 2 is a waveform diagram showing an example of a relationship between a current Iac outputted from an output circuit OC (bridge circuit BC) and drive signals SD1 to SD4 outputted from a driving circuit DC shown in FIG. 1.
Figure 3:
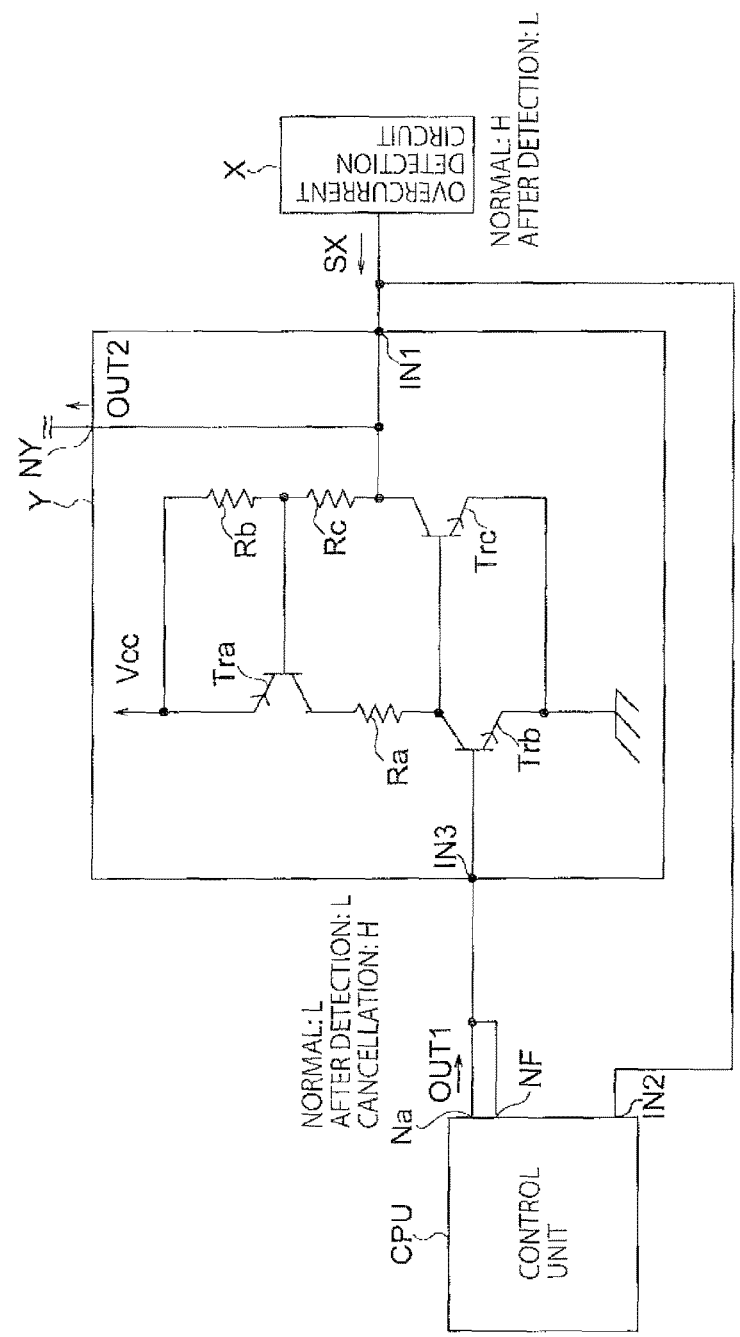
FIG. 3 is a diagram illustrating an example of a circuit configuration of an off-state fixing circuit Y shown in FIG. 1.
Figure 4:
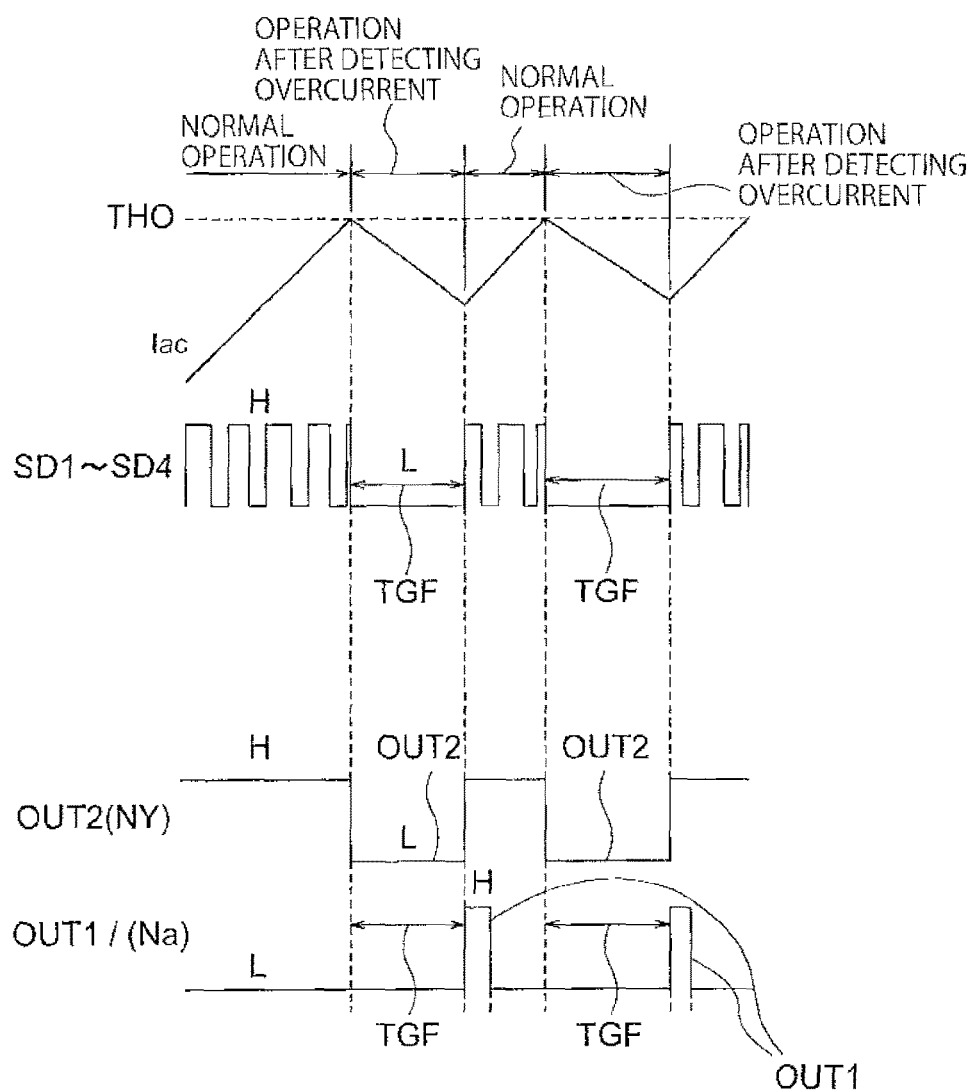
FIG. 4 is a waveform diagram showing an example of a relationship among the current Iac outputted from the output circuit OC (bridge circuit BC) and the drive signals SD1 to SD4 outputted from the driving circuit DC shown in FIG. 1, and signals outputted from the off-state fixing circuit Y shown in FIG. 3.

FIG. 1 is a diagram illustrating an example of a configuration of a power supply device 100 according to a first embodiment. FIG. 2 is a waveform diagram showing an example of a relationship between a current Iac outputted from an output circuit OC (bridge circuit BC) and drive signals SD1 to SD4 outputted from a driving circuit DC shown in FIG. 1. FIG. 3 is a diagram illustrating an example of a circuit configuration of an off-state fixing circuit Y shown in FIG. 1. FIG. 4 is a waveform diagram showing an example of a relationship among the current Iac outputted from the output circuit OC (bridge circuit BC) and the drive signals SD1 to SD4 outputted from the driving circuit DC shown in FIG. 1, and signals outputted from the off-state fixing circuit Y shown in FIG. 3. In FIGS. 2 and 4, the drive signals SD1 to SD4 are illustrated as having a single waveform for the sake of simplification.

The power supply device 100 according to the first embodiment is, for example, an inverter or a converter. The power supply device 100 includes, for example, an output circuit OC, a driving circuit DC, an overcurrent detection circuit X, an off-state fixing circuit Y, and a control unit (microcomputer) CPU, as shown in FIG. 1.

The output circuit OC is configured to be supplied with electric power from a power supply Vcc, and output a predetermined current Iac to a first output terminal TO1 and a second output terminal TO2.

The output circuit OC is, for example, a bridge circuit BC that controls the electric power supplied from the power supply Vcc, and makes a controlled output, as shown in FIG. 1.

For example, the bridge circuit BC includes a first output transistor Tr1, a second output transistor Tr2, a third output transistor Tr3, a fourth output transistor Tr4, a first detection resistor R1, and a second detection resistor R2, as shown in FIG. 1.

For example, as shown in FIG. 1, the first output transistor Tr1 is, an NPN-type bipolar transistor having an end (collector) that is connected to the power supply Vcc, another end (emitter) that is connected to the first output terminal TO1, and a base to which a drive signal SD1 is inputted.

The second output transistor Tr2 is an NPN-type bipolar transistor having an end (collector) that is connected to the power supply Vcc, another end (emitter) that is connected to the second output terminal TO2, and a base to which a drive signal SD2 is inputted.

The third output transistor Tr3 is an NPN-type bipolar transistor having an end (collector) that Is connected to the first output terminal TO1, another end (emitter) that is connected to a fixed potential (ground), and a base, to which a drive signal SD3 is inputted.

The fourth output transistor Tr4 is an NPN-type bipolar transistor having an end (collector) that is connected to the second output terminal TO2, another end (emitter) that is connected to the fixed potential (ground), and a base, to which a drive signal SD3 is inputted.

The first detection resistor R1 has an end that is connected to the other end (emitter) of the third output transistor Tr3, and another end that is connected to the fixed potential (ground).

The second detection resistor R2 has an end that is connected to the other end (emitter) of the fourth output transistor Tr4, and another end that is connected to the fixed potential (ground).

The driving circuit DC shown in FIG. 1 is configured to control an output operation for outputting a current of the output circuit OC.

For example, as shown in FIG. 1, the driving circuit DC Includes, a first high-side logic circuit AH1, a second high-side logic circuit AH2, a first low-side logic circuit AL1, a second low-side logic circuit AL2, a high-side driver DCH, and a low-side driver DCL.

The first high-side logic circuit AH1 is configured to output a logic signal SH1 obtained by performing a calculation based on a first control signal SC1 and a potential at a first node IN1.

The second high-side logic circuit AH2 is configured to output a logic signal SH2 obtained by performing a calculation based on a second control signal SC2 and the potential at the first node IN1.

The first low-side logic circuit AL1 is configured to output a logic signal SL1 obtained by performing a calculation based on a third control signal SC3 and the potential at the first node IN1.

The second low-side logic circuit AL2 Is configured to output a logic signal SL2 obtained by performing a calculation based on a fourth control signal SC4 and the potential at the first node IN1.

The high-side driver DCH is configured to control the output operation for outputting a current of the output circuit OC with the drive signals SD1 and SD2 based on the logic signals SH1 and SH2 (to control the first and second output transistors Tr1 and Tr2).

The low-side driver DCL is configured to control the output operation for outputting a current of the output circuit OC with the drive signals SD3 and SD4 based on the logic signals SL1 and SL2 (to control the third and fourth output transistors Tr3 and Tr4).

During a normal operation, the driving circuit DC controls the operation of the first to fourth output transistors Tr1 to Tr4 based on the first to fourth control signals SC1 to SC4, thereby controlling the output operation of the bridge circuit BC.

During the normal operation, the output circuit OC complementarily turns on or off the first and second output transistors Tr1 and Tr2 and complementarily turns on or off the third and fourth output transistors Tr3 and Tr4 in response to the drive signals SD1 to SD4 so as not to allow a through-current to flow. Thus, as described above, the output circuit OC outputs a predetermined current to the first and second output terminals TO1 and TO2 based on the electric power supplied from the power supply Vcc.

When the overcurrent detection circuit X detects an overcurrent, the driving circuit DC suspends the operation of the first to fourth output transistors Tr1 to Tr4 in response to an off-state fixing signal OUT2 outputted from the off-state fixing circuit Y based on a detection signal SX Inputted to the first node IN1.

Thereafter, the driving circuit DC cancels the suspension of the operation of the first to fourth output transistors Tr1 to Tr4 when the supply of the off-state fixing signal OUT2 from the off-state fixing circuit Y is stopped in response to a cancellation signal OUT1.

The driving circuit DC then controls the operation of the first to fourth output transistors Tr1 to Tr4 in response to the first to fourth control signals SC1 to SC4.

The overcurrent detection circuit X shown in FIG. 1 is configured to output the detection signal SX (for example, a "Low" level signal) to the first node IN1 when detecting the overcurrent of the output circuit OC. The overcurrent detection circuit X Is also configured not to output the "Low" level detection signal SX to the first node IN1 (namely, output a "High" level signal) when detecting no overcurrent that is caused by the output operation of the output circuit OC.

For example, the overcurrent detection circuit X is configured to output the detection signal SX when the current outputted from the output circuit OC has a value equal to or more than an overcurrent threshold value THO that is predetermined, and not to output the detection signal SX when the current outputted from the output circuit OC has a value less than the overcurrent threshold value THO.

As shown in FIG. 1, for example, the overcurrent detection circuit X detects a current value of a current flowing through the first detection resistor R1 and the current value of a current flowing through the second detection resistor R2, and based on the detection results, detects the overcurrent of the output circuit OC.

In more detail, the overcurrent detection circuit X detects the currents flowing through the first and second detection resistors R1 and R2 to detect whether a current Iac outputted from the bridge circuit BC Is in an overcurrent state, and outputs the detection signal SX (for example, the "Low" level signal) based on the detection result.

The off-state fixing circuit Y shown in FIG. 1 is configured to output the off-state fixing signal OUT2 from an output node NY to the driving circuit DC, for forcibly suspending the output operation of the output circuit OC regardless of whether the first to fourth control signals SC1 to SC4 are being outputted, based on the detection signal SX inputted to the first node IN1.

The off-state fixing circuit Y includes, for example, a first PNP-type bipolar transistor Tra, a first NPN-type bipolar transistor Trb, a first control resistor Ra, a second control resistor Rb, a third control resistor Rc, and a second NPN-type bipolar transistor Trc, as shown in FIG. 3.

In the example of FIG. 3, the output node NY Is connected to the first node IN1.

The first PNP-type bipolar transistor Tra has an emitter that is connected to the power supply Vcc.

The first control resistor Ra has an end that Is connected to a collector of the first PNP-type bipolar transistor Tra.

The first NPN-type bipolar transistor Trb has a collector that is connected to another end of the first control resistor Ra, an emitter that is connected to the fixed potential (ground), and a base to which the cancellation signal OUT1 is inputted from the control unit CPU.

The second control resistor Rb has an end that is connected to the power supply Vcc, and another end that is connected to a base of the first PNP-type bipolar transistor Tra.

The third control resistor Rc has an end that is connected to the other end of the second control resistor Rb, and another end that is connected to the first node IN1.

The second NPN-type bipolar transistor Trc has a collector that is connected to the other end of the third control resistor Rc, an emitter that Is connected to the fixed potential (ground), and a base that is connected to the other end of the first control resistor Ra.

The off-state fixing circuit Y receives the detection signal SX ("Low" level) at the first node IN1, outputs the detection signal SX as the off-state fixing signal OUT2 to the driving circuit DC (latches the potential at the first node IN1 to be the "Low" level), and then controls the potential at the first node IN1 (to be latched at the "High" level) to stop the output of the off-state fixing signal OUT2 in response to the input of the cancellation signal OUT1 ("High" level).

The off-state fixing circuit Y thus outputs a signal based on the potential at the first node IN1 to the driving circuit DC as the off-state fixing signal OUT2 in response to the detection signal SX outputted from the overcurrent detection circuit X.

The off-state fixing circuit Y stops the output of the off-state fixing signal OUT2 to the driving circuit DC in response to the cancellation signal OUT1 outputted from the control unit CPU.

The control unit CPU receives the detection signal SX (via a second node IN2), and outputs the first to fourth control signals (PWM signals) SC1 to SC4 to the driving circuit DC for controlling the output operation of the output circuit OC by means of the driving circuit DC, as shown in FIG. 1, for example.

The driving circuit DC is configured to perform a forcible suspension of the output operation of the output circuit OC in response to the off-state fixing signal OUT2, regardless of whether the first to fourth control signals SC1 to SC4 are inputted.

The control unit CPU is configured to output, to the off-state fixing circuit Y, the cancellation signal OUT1 (for example, "High" level) for cancelling the forcible suspension of the output operation of the output circuit OC after an off period TGF passes from the input of the detection signal SX.

The off-state fixing circuit Y is configured to stop the output of the off-state fixing signal OUT2 In response to the cancellation signal OUT1 (for example, "High" level), so that the driving circuit DC returns to the normal operation for controlling the output operation of the output circuit OC in accordance with the first to fourth control signals SC1 to SC4.

After the control unit CPU outputs the cancellation signal OUT1, if the detection signal SX ("Low" level) is not inputted to the second node IN2, the control unit CPU outputs the first to fourth control signals SC1 to SC4 for controlling the output operation of the output circuit OC to the driving circuit DC in order to control the output operation of the output circuit OC by means of the driving circuit DC.

As a result, the control unit CPU may be appropriately returned to the normal operation if no overcurrent is detected after the cancellation signal OUT1 is outputted.

The control unit CPU performs a feedback of the outputted cancellation signal OUT1, detects whether there is an abnormal state in the cancellation signal (for example, the predetermined signal is not being outputted) in the feedback, and, if detecting an abnormal state of the cancellation signal, controls the driving circuit DC with the first to fourth control signals SC1 to SC4 to stop the output operation of the output circuit OC.

If an abnormal condition (for example, the predetermined signal is not being outputted) occurs to the cancellation signal, the output operation of the output circuit OC may be stopped to prevent an erroneous operation of the power supply device 100 in this manner.

The control unit CPU is configured to set the off period TGF, during which the output operation of the output circuit OC is forcibly stopped, by, for example, software.

This may improve the degree of freedom in setting the off period TGF during which the output operation of the output circuit OC is forcibly suspended.

An example of the operation of the power supply device 100 according to the first embodiment having the above-described configuration will be described with reference to FIG. 4.

First, in the normal operation, the control unit CPU outputs the first to fourth control signals (PWM signals) SC1 to SC4 for controlling the output operation of the output circuit OC to the driving circuit DC to control the output operation of the output circuit OC by means of the driving circuit DC, as shown in FIG. 4.

During the normal operation, if the overcurrent detection circuit X does not detect an overcurrent caused by the output operation of the output circuit OC (if the current outputted from the output circuit OC has a value less than the overcurrent threshold value THO), no detection signal SX at the "Low" level Is outputted to the first node IN1 (a "High" level signal is outputted).

The off-state fixing circuit Y stops the output of the off-state fixing signal OUT2 (and outputs the "High" level signal) to the driving circuit DC in response to the signal ("Low" level signal) outputted from an output node Na of the control unit CPU.

During the normal operation, the driving circuit DC controls the operation of the first to fourth output transistors Tr1 to Tr4 based on the first to fourth control signals SC1 to SC4 to control the electric power outputting operation of the bridge circuit BC.

Thereafter, when the overcurrent detection circuit X detects an overcurrent caused by the output operation of the output circuit OC (when the current lac outputted from the output circuit OC reaches the overcurrent threshold value THO), the overcurrent detection circuit X outputs the detection signal SX ("Low" level signal) depending on the detection result.

The off-state fixing circuit Y outputs the detection signal SX received at the first node IN1 as the off-state fixing signal OUT2 to the driving circuit DC (latches the potential at the first node IN1 to be at the "Low" level).

In response to the off-state fixing signal OUT2 outputted from the off-state fixing circuit Y, the driving circuit DC stops the operation of the first to fourth output transistors Tr1 to Tr4 to forcibly suspend the output operation of the output circuit OC regardless of whether the first to fourth control signals SC1 to SC4 are being inputted.

This leads to a reduction in the current lac outputted from the output circuit OC.

Consequently, after the off period TGF passes after the detection signal SX is inputted, the control unit CPU outputs the cancellation signal OUT1 (for example, "High" level) to the off-state fixing circuit Y for cancelling the forcible suspension of the output operation of the output circuit OC.

When the cancellation signal OUT1 ("High" level signal) is inputted, the off-state fixing circuit Y controls the potential at the first node IN1 (latching the potential to be at the "High" level) to stop the output of the off-state fixing signal OUT2.

When the output of the off-state fixing signal OUT2 from the off-state fixing circuit Y is stopped, the driving circuit DC returns to the normal operation to control the output operation of the output circuit OC based on the first to fourth control signals SC1 to SC4.

As described above, after the control unit CPU outputs the cancellation signal OUT1, if the detection signal SX ("Low" level) is not Inputted to the second node IN2, the control unit CPU outputs the first to fourth control signals SC1 to SC4 to the driving circuit DC for controlling the output operation of the output circuit OC to control the output operation of the output circuit OC by means of the driving circuit DC.

Thus, after the cancellation signal OUT1 is outputted, if no overcurrent is detected, the power supply device 100 may suitably return to the normal operation.

As described above, a power supply device according to an aspect of the present invention includes an output circuit OC configured to be supplied with electric power from a power supply and output a current, a driving circuit DC configured to control an output operation for outputting the current from the output circuit, an overcurrent detection circuit X configured to output a detection signal SX to a first node IN1 when detecting an overcurrent in the output circuit, an off-state fixing circuit Y configured to output an off-state fixing signal OUT2 to the driving circuit for forcibly suspending the output operation of the output circuit regardless of whether first to fourth control signals SC1 to SC4 are outputted, based on the detection signal SX inputted to the first node, and a control unit CPU configured to receive the detection signal SX and output the first to fourth control signals SC1 to SC4 to the driving circuit for controlling the output operation of the output circuit in order to control the output operation of the output circuit by means of the driving circuit.

In response to the off-state fixing signal, the driving circuit performs a forcible suspension of the output operation of the output circuit regardless of whether the first to fourth control signals SC1 to SC4 are inputted. After a predetermined off period TGF passes from the input of the detection signal SX, the control unit outputs a cancellation signal to the off-state fixing circuit for cancelling the forcible suspension of the output operation of the output circuit. In response to the cancellation signal, the off-state fixing circuit stops the output of the off-state fixing signal to cause the driving circuit to return to the normal operation in which the driving circuit controls the output operation of the output circuit based on the first to fourth control signals SC1 to SC4.

Thus, in the power supply device according to the present invention, the output circuit is forcibly suspended based on a detection result of the overcurrent detection circuit, and caused to return to the normal operation based on the cancellation signal that is outputted after an off period TGF, which set by the control unit CPU, passes.

By counting, by means of the control unit CPU, the period during which the output circuit is suspended when an overcurrent is caused in the output circuit, and processing other processes by means of hardware, the process load of the control unit CPU may be reduced even if the switching frequency is high.

Since the period during which the output circuit is suspended when the overcurrent is caused is set by the control unit CPU, the operation is not affected by the temperature and the accuracy, and the setting may be changed easily by a communication.

(Modification 1)

In the first embodiment, an example of a circuit configuration of the off-state fixing circuit Y is described, the off-state fixing circuit Y being configured to output, from the output node NY to the driving circuit DC, the off-state fixing signal OUT2 for forcibly suspending the output operation of the output circuit OC based on the detection signal SX inputted to the first node IN1, regardless of whether the first to fourth control signals SC1 to SC4 are inputted to the driving circuit DC.

The off-state fixing circuit Y may have a different circuit configuration if a similar function may be provided. Modification 1 is another example of the circuit configuration of the off-state fixing circuit Y.

Figure 5:
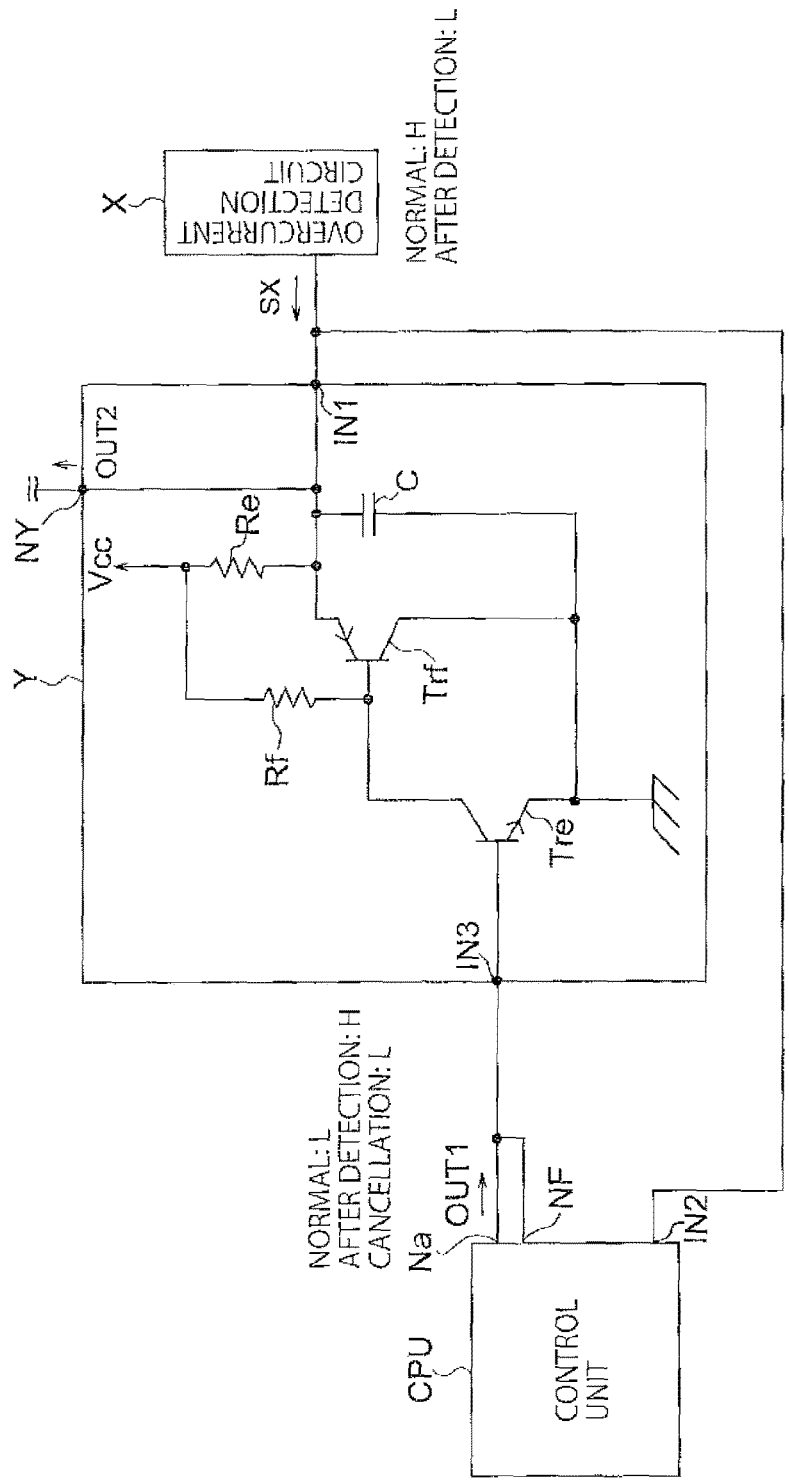
FIG. 5 is a diagram illustrating another example of the circuit configuration of the off-state fixing circuit Y shown in FIG. 1 according to Modification 1.
Figure 6:
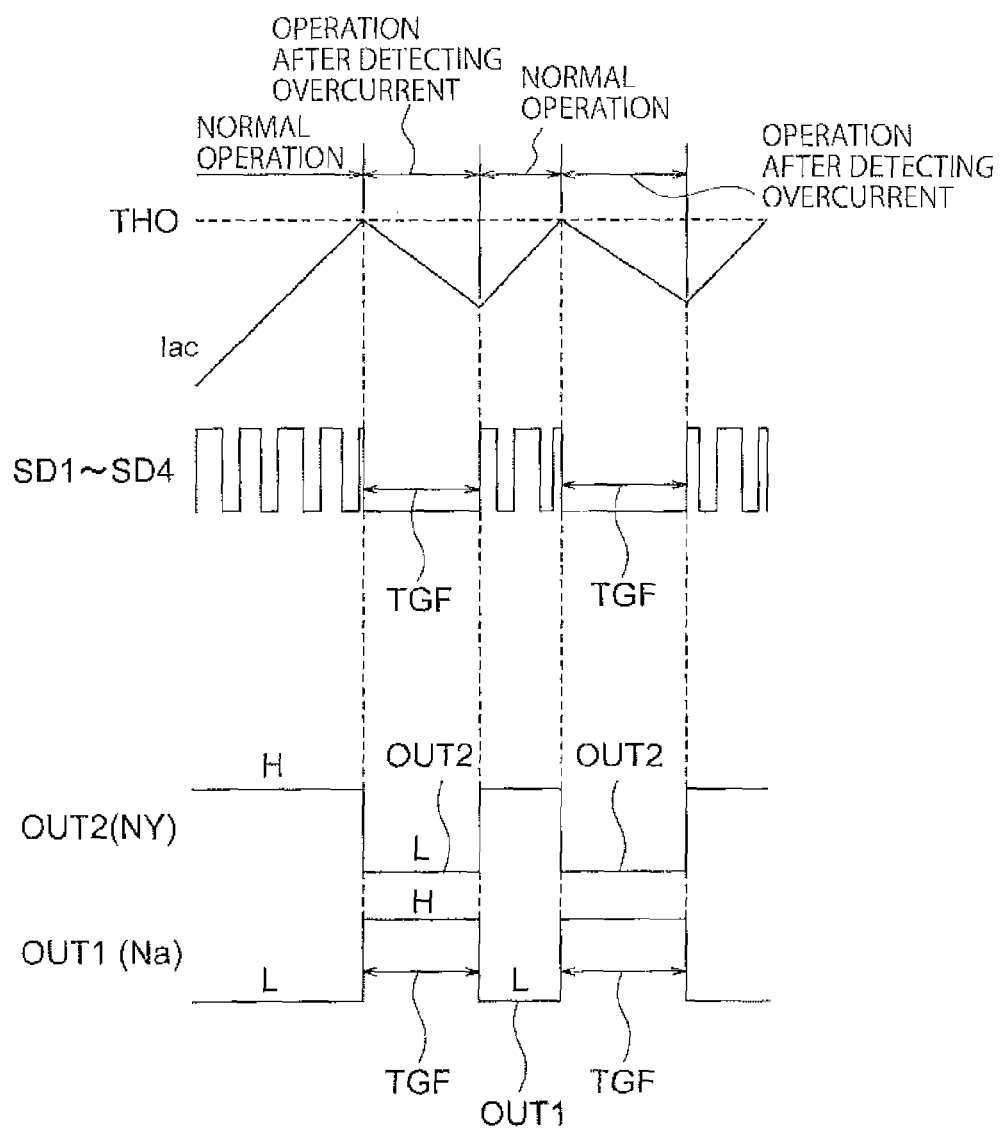
FIG. 6 is a waveform diagram showing an example of a relationship among the current Iac outputted from the output circuit OC (bridge circuit BC) and the drive signals SD1 to SD4 outputted from the driving circuit DC shown in FIG. 1, and signals outputted from the off-state fixing circuit Y shown in FIG. 5.

FIG. 5 is a diagram illustrating another example of the circuit configuration of the off-state fixing circuit Y shown in FIG. 1 according to Modification 1. FIG. 6 is a waveform diagram showing an example of a relationship between the current Iac outputted from the output circuit OC (bridge circuit BC) shown in FIG. 1, the drive signals SD1 to SD4 outputted from the driving circuit DC, and signals outputted from the off-state fixing circuit Y shown in FIG. 5. In the example of FIG. 6, the drive signals SD1 to SD4 are illustrated as having a single waveform for the sake of simplification. In FIG. 5, the reference codes that are the same as those in FIG. 1 denote the same elements as the first embodiment.

For example, as shown in FIG. 5, the off-state fixing circuit Y has a first control resistor Re, a second control resistor Rf, a capacitor C, a PNP-type bipolar transistor Trf, and an NPN-type bipolar transistor Tre.

The first control resistor Re has an end that Is connected to the power supply Vcc, and another end that is connected to the first node IN1 (output node NY).

The second control resistor Rf has an end that is connected to the power supply Vcc.

The capacitor C has an end that is connected to the first node IN1, and another end that is connected to the fixed potential (ground).

The PNP-type bipolar transistor Trf has an emitter that is connected to the first node IN1, collector that is connected to the fixed potential (ground), and a base that is connected to another end of the second control resistor Rf.

The NPN-type bipolar transistor Tre has a collector that is connected to the other end of the second control resistor Rf, an emitter that is connected to the fixed potential (ground), and a base to which the cancellation signal outputted from the output node Na of the control unit CPU is inputted via a third node IN3. The base of the NPN-type bipolar transistor Tre is connected to the output node Na of the control unit CPU via the third node IN3, as shown in FIG. 5, for example.

The output node NY for outputting the off-state fixing signal is connected to the first node IN1.

The off-state fixing circuit Y is configured to output a signal based on the potential at the first node IN1 to the driving circuit DCA as the off-state fixing signal OUT2, in response to the detection signal SX outputted from the overcurrent detection circuit X.

The off-state fixing circuit Y is also configured to stop the output of the off-state fixing signal OUT2 to the driving circuit DC in response to the cancellation signal OUT1 outputted from the control unit CPU.

An example of the operation of the power supply device 100 according to Modification 1 will be described with reference to FIG. 6.

First, during a normal operation, the control unit CPU controls the output operation of the output circuit OC by means of the driving circuit DC by outputting the first to fourth control signals (PWM signals) SC1 to SC4 for controlling the output operation of the output circuit OC to the driving circuit DC, as shown in FIG. 6, for example.

During the normal operation, the overcurrent detection circuit X does not output the detection signal SX at the "Low" level (therefore, outputs the "High" level signal) to the first node IN1 if no overcurrent caused by the output operation of the output circuit OC is detected (if the current outputted from the output circuit OC has a value less than the overcurrent threshold value THO).

The off-state fixing circuit Y stops the output of the off-state fixing signal OUT2 (outputs the "High" level signal) to the driving circuit DC in response to the signal ("Low" level signal) outputted from the output node Na of the control unit CPU during the normal operation.

During the normal operation, the driving circuit DC controls the output of electric power from the bridge circuit BC by controlling the operation of the first to fourth output transistors Tr1 to Tr4 based on the first to fourth control signals SC1 to SC4.

Thereafter, if the overcurrent detection circuit X detects an overcurrent caused by the output operation of the output circuit OC (if the current Iac outputted from the output circuit OC reaches the overcurrent threshold value THO), the overcurrent detection circuit X outputs the detection signal SX ("Low" level signal) in accordance with the detection result.

The off-state fixing circuit Y outputs the detection signal SX Inputted to the first node IN1 as the off-state fixing signal OUT2 to the driving circuit DC (latches the potential at the first node IN1 to be at the "Low" level in accordance with the "High" level signal outputted from the output node Na of the control unit CPU).

In response to the off-state fixing signal OUT2 outputted from the off-state fixing circuit Y, the driving circuit DC forcibly suspends the output operation of the output circuit OC by suspending the operation of the first to fourth output transistors Tr1 to Tr4, regardless of whether the first to fourth control signals SC1 to SC4 are inputted.

This leads to a reduction in the current Iac outputted from the output circuit OC.

Thereafter, the control unit CPU outputs the cancellation signal OUT1 (here, "Low" level signal) for cancelling the forcible suspension of the output operation of the output circuit OC to the off-state fixing circuit Y after the off period TGF passes from the input of the detection signal SX.

In response to the input of the cancellation signal OUT1 ("Low" level signal), the off-state fixing circuit Y controls the potential at the first node IN1 to stop the output of the off-state fixing signal OUT2 (to latch the signal at "High" level).

As described above, when the output of the off-state fixing signal OUT2 from the off-state fixing circuit Y is stopped, the driving circuit DC returns to the normal operation to control the output circuit OC based on the first to fourth control signals SC1 to SC4.

As described above, after the control unit CPU outputs the cancellation signal OUT1, if the detection signal SX ("Low" level) is not inputted to the second node IN2, the control unit CPU outputs the first to fourth control signals SC1 to SC4 for controlling the output operation of the output circuit OC to the driving circuit DC, in order to control the output operation of the output circuit OC by means of the driving circuit DC.

This enables the power supply device 100 to appropriately return to the normal operation if, after the cancellation signal OUT1 is outputted, no overcurrent is detected.

Thus, also in Modification 1, in response to the off-state fixing signal OUT2, the driving circuit DC forcibly suspends the output operation of the output circuit OC regardless of whether the first to fourth control signals SC1 to SC4 are inputted, the control unit CPU outputs the cancellation signal OUT1 for cancelling the forcible suspension of the output operation of the output circuit OC to the off-state fixing circuit Y after the predetermined off period TGF passes from the input of the detection signal SX, and in response to the cancellation signal OUT1, the off-state fixing circuit Y stops the output of the off-state fixing signal OUT2 so that the driving circuit DC returns to the normal operation to control the output circuit OC based on the first to fourth control signals SC1 to SC4.

Thus, in the power supply device according to Modification 1, like that of the first embodiment, the operation of the output circuit is forcibly suspended based on the detection result of the overcurrent detection circuit, and in response to the cancellation signal that is outputted after the off period TGF set by the control unit CPU passes, the output circuit is caused to return to the normal operation.

Thus, the processing load of the control unit CPU may be reduced even if the switching frequency is high by counting, by the control unit CPU, the period during which the output circuit is turned off when an overcurrent is caused in the output circuit, and performing other processes by means of hardware.

(Modification 2)

Another example of the circuit configuration of the off-state fixing circuit Y will be described as Modification 2 below.

Figure 7:
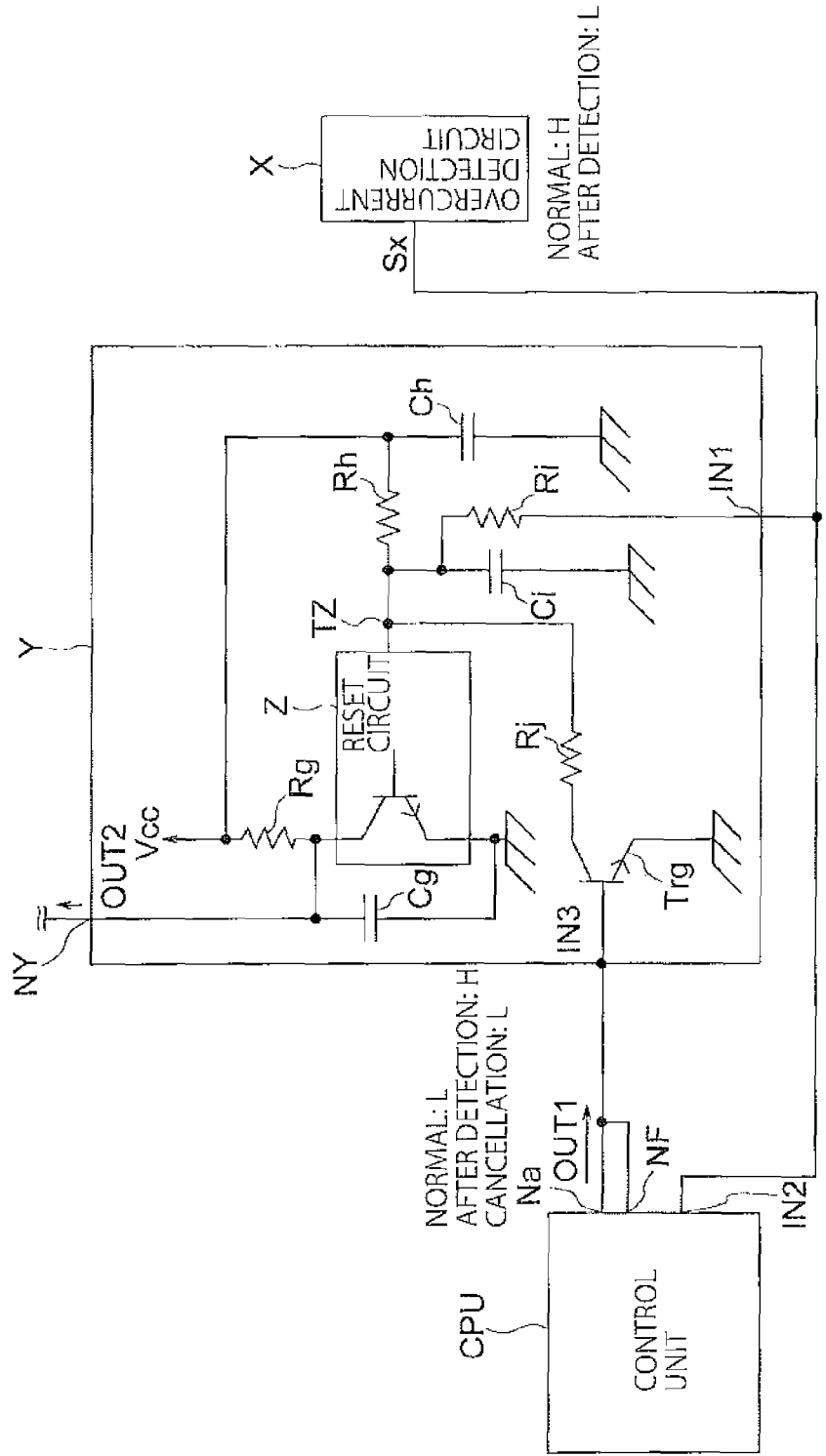
FIG. 7 is a diagram illustrating a further example of the circuit configuration of the off-state fixing circuit Y shown in FIG. 1 according to Modification 2.
Figure 8:
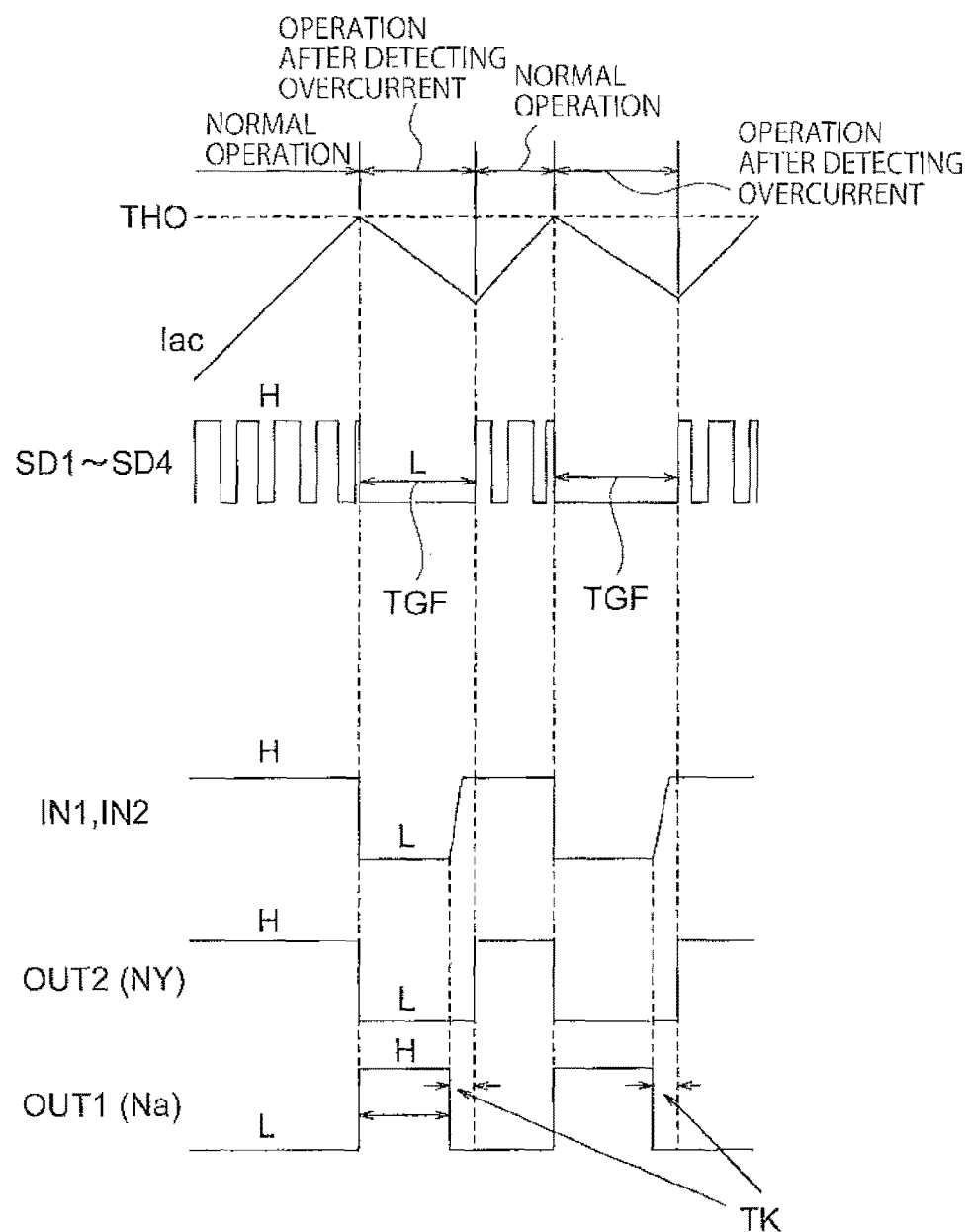
FIG. 8 is a waveform diagram showing an example of a relationship among the current Iac outputted from the output circuit OC (bridge circuit BC) and the drive signals SD1 to SD4 outputted from the driving circuit DC shown in FIG. 1, and signals outputted from the off-state fixing circuit Y shown in FIG. 7.
Figure 9:
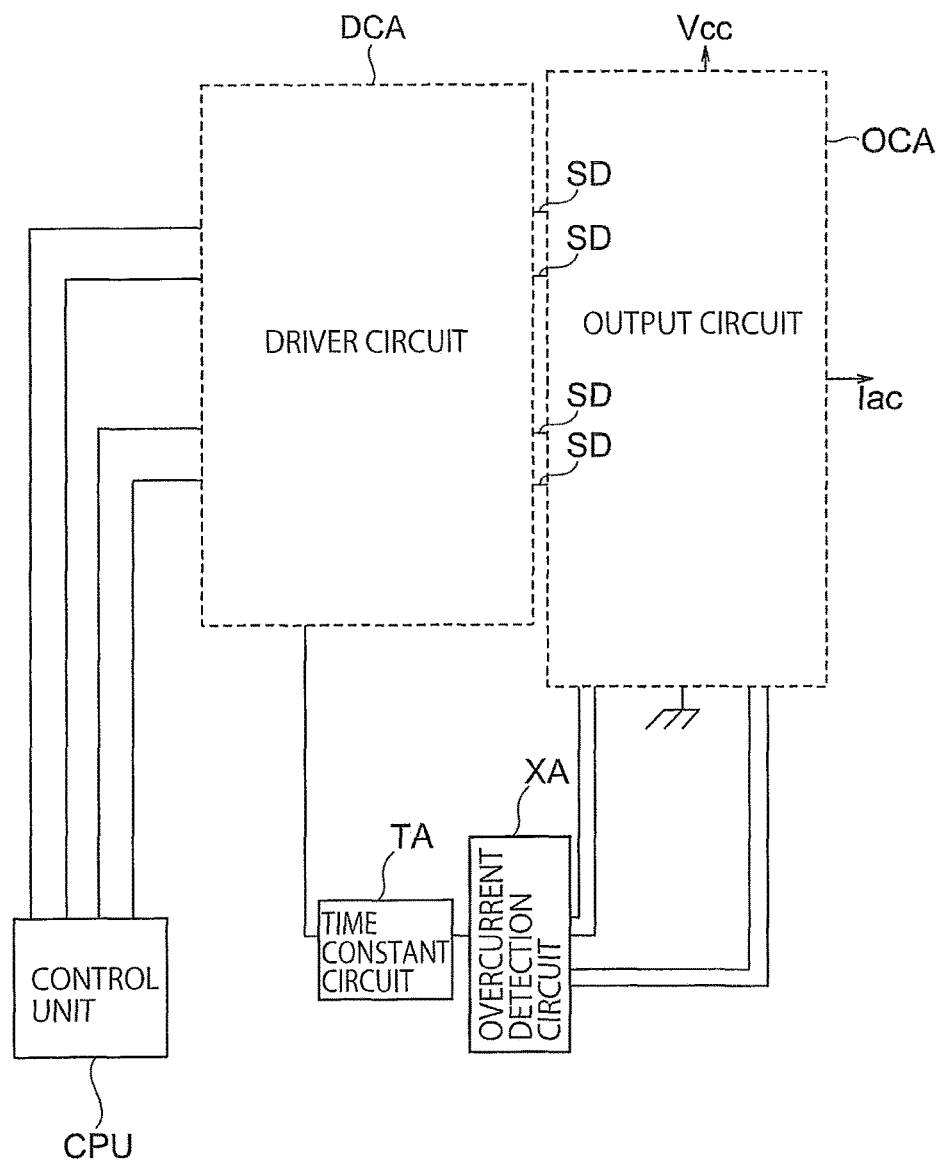
FIG. 9 is a diagram illustrating an example of a configuration of a conventional power supply device 100A.
Figure 10:
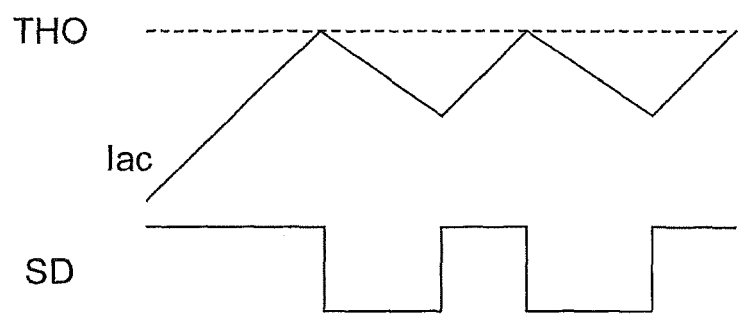
FIG. 10 is a waveform diagram showing an example of a relationship between a current Iac outputted from an output circuit OCA and a drive signal SD outputted from a driving circuit DCA shown in FIG. 9.

FIG. 7 is a diagram illustrating a further example of the circuit configuration of the off-state fixing circuit Y shown in FIG. 1 according to Modification 2. FIG. 8 is a waveform diagram showing an example of a relationship among the current Iac outputted from the output circuit OC (bridge circuit BC) and the drive signals SD1 to SD4 outputted from the driving circuit DC shown in FIG. 1, and signals outputted from the off-state fixing circuit Y shown in FIG. 7. In the example of FIG. 8, the drive signals SD1 to SD4 are illustrated as having a single waveform for the sake of simplification. In FIG. 7, the reference codes that are the same as those in FIG. 1 denote the same elements as the first embodiment. The configuration of the power supply device 100 according to Modification 2 is the same as that according to the first embodiment except for the off-state fixing circuit Y.

For example, as shown in FIG. 7, the off-state fixing circuit Y Includes a first control resistor Rg, a second control resistor Rh, a third control resistor Ri, a first capacitor Cg, a second capacitor Ch, a third capacitor Ci, a fourth control resistor Rj, an NPN-type bipolar transistor Trg, and a reset circuit Z.

The first control resistor Rg has an end that Is connected to the power supply Vcc, and another end that is connected to the output node NY.

The second control resistor Rh has an end that is connected to the power supply Vcc.

The third control resistor Ri has an end that is connected to another end of the second control resistor Rh, and another end that is connected to the first node IN1.

The first capacitor Cg has an end that is connected to the other end of the first control resistor Rg, and another end that is connected to the fixed potential (ground).

The second capacitor Ch has an end that is connected to the end of the second control resistor Rh, and another end that is connected to the fixed potential (ground).

The third capacitor Ci has an end that is connected to the other end of the second control resistor Rh, and another end that is connected to the fixed potential (ground).

The fourth control resistor Rj has an end that is connected to the other end of the second control resistor Rh.

The NPN-type bipolar transistor Trg has a collector that is connected to another end of the fourth control resistor Rj, an emitter that is connected to the fixed potential (ground), and a base to which the cancellation signal OUT1 from the control unit CPU is inputted. As shown in FIG. 7, for example, the base of the NPN-type bipolar transistor Trg is connected to the output node Na of the control unit CPU via the third node IN3.

The reset circuit Z has an end that is connected to the other end of the first control resistor Rg, and another end that is connected to the fixed potential (ground).

For example, the reset circuit Z Is configured to electrically connect the end and the other end of the first capacitor Cg to discharge the first capacitor Cg when the potential at the other end of the second control resistor Rh is less than a reset threshold value that is predetermined (if the NPN-type bipolar transistor Trg is turned on in response to the "High" level signal outputted from the control unit CPU).

This causes the off-state fixing circuit Y to output the detection signal SX inputted to the first node IN1 to the driving circuit DC as the off-state fixing signal OUT2 (latches the potential at the first node IN1 to be at the "Low" level).

The reset circuit Z is also configured to electrically disconnect the end and the other end of the first capacitor Cg after a predetermined retention time TK passes from time when the potential at the other end of the second control resistor Rh becomes equal to or greater than the reset threshold value (when the NPN-type bipolar transistor Trg is turned off in response to the "Low" level signal outputted from the control unit CPU).

As a result, the off-state fixing circuit Y controls the potential at the first node IN1 (so as to be latched at the "High" level) in order to stop the output of the off-state fixing signal OUT2 in response to the input of the cancellation signal OUT1 ("High" level signal).

Thus, the off-state fixing circuit Y outputs the signal based on the potential at the first node IN1 to the driving circuit DC as the off-state fixing signal OUT2 in response to the detection signal X outputted from the overcurrent detection circuit X.

The off-state fixing circuit Y is also configured to stop the output of the off-state fixing signal OUT2 to the driving circuit DC In response to the cancellation signal OUT1 outputted from the control unit CPU.

An example of the operation of the power supply device 100 according to Modification 2 having the above-described configuration will be described with reference to FIG. 8.

First, during a normal operation, for example, the control unit CPU outputs the first to fourth control signals (PWM signals) SC1 to SC4 for controlling the output operation of the output circuit OC to the driving circuit DC, as shown in FIG. 8, so as to control the output circuit OC by means of the driving circuit DC.

During the normal operation, when the overcurrent detection circuit X does not detect an overcurrent caused by the output operation of the output circuit OC (when the current outputted from the output circuit OC has a value less than an overcurrent threshold value THO), the overcurrent detection circuit X does not output the detection signal SX at the "Low" level to the first node IN1 (therefore, outputs the "High" level signal).

The off-state fixing circuit Y stops the output of the off-state fixing signal OUT2 to the driving circuit DC (therefore outputs the "High" level signal) In response to the signal outputted from the output node Na ("Low" level signal) of the control unit CPU.

During the normal operation, the driving circuit DC controls the operation of the first to fourth output transistors Tr1 to Tr4 based on the first to fourth control signals SC1 to SC4 to control the output operation of the bridge circuit BC to output electric power.

The reset circuit Z electrically disconnects the end and the other end of the first capacitor Cg after a predetermined retention period TK passes from time when the potential at the other end of the second control resistor Rh becomes equal to or greater than the reset threshold value (when the NPN-type bipolar transistor Trg is turned off in response to the "Low" level signal outputted from the control unit CPU).

Thus, the off-state fixing circuit Y controls the potential at the first node IN1 (to be latched at the "High" level) to stop the output of the off-state fixing signal OUT2 in response to the input of the cancellation signal OUT1 (at the "Low" level signal here).

Thereafter, when the overcurrent detection circuit X detects an overcurrent caused by the output operation of the output circuit OC (when the current Iac outputted from the output circuit OC reaches the overcurrent threshold value THO), the overcurrent detection circuit X outputs the detection signal SX ("Low" level signal) in response to the detection result.

When the potential at the other end of the second control resistor Rh is less than the reset threshold value that is preset (when the NPN-type bipolar transistor Trg is turned on in response to the "High" level signal outputted from the control unit CPU according to the detection signal SX), the reset circuit Z electrically connects the end and the other end of the first capacitor Cg to discharge the first capacitor Cg.

As a result, the off-state fixing circuit Y outputs the detection signal SX inputted to the first node IN1 to the driving circuit DC as the off-state fixing signal OUT2 (latches the potential at the first node IN1 to be at the "Low" level).

In response to the off-state fixing signal OUT2 outputted from the off-state fixing circuit Y, the driving circuit DC stops the operation of the first to fourth output transistors Tr1 to Tr4 to forcibly suspend the output operation of the output circuit OC regardless of whether the first to fourth control signals SC1 to SC4 are inputted.

This leads to a reduction in the current Iac outputted from the output circuit OC.

Thereafter, the control unit CPU outputs the cancellation signal OUT1 ("Low" level signal here) for cancelling the forcible suspension of the output operation of the output circuit OC to the off-state fixing circuit Y after the off period TGF passes from the input of the detection signal SX.

In response to the input of the cancellation signal OUT1 ("Low" level signal), the off-state fixing circuit Y controls the potential at the first node IN1 to stop the output of the off-state fixing signal OUT2 (latches the potential at the first node IN1 to be at the "High" level).

When the output of the off-state fixing signal OUT2 from the off-state fixing circuit Y is stopped, the driving circuit DC returns to the normal operation for controlling the output operation of the output circuit OC based on the first to fourth control signals SC1 to SC4.

As described above, if the detection signal SX ("Low" level) is not Inputted to the second node IN2 after the control unit CPU outputs the cancellation signal OUT1, the control unit CPU outputs the first to fourth control signals SC1 to SC4 for controlling the output operation of the output circuit OC to the driving circuit DC, in order to control the output operation of the output circuit OC by means of the driving circuit DC.

Thus, if no overcurrent is detected after the output of the cancellation signal OUT1, the power supply device 100 may appropriately return to the normal operation.

As described above, also in Modification 2, the driving circuit DC forcibly suspends the output operation of output circuit OC in response to the off-state fixing signal OUT2, regardless of whether the first to fourth control signals SC1 to SC4 are inputted, the control unit CPU outputs the cancellation signal OUT1 for cancelling the forcible suspension of the output operation of the output circuit OC to the off-state fixing circuit Y after the off period TGF passes from the input of the detection signal SX, the off-state fixing circuit Y stops the output of the off-state fixing signal OUT2 in response to the cancellation signal OUT1 to cause the driving circuit DC to return to the normal operation for controlling the output operation of the output circuit OC based on the first to fourth control signals SC1 to SC4.

Thus, in the power supply device according to Modification 2, like that according to the first embodiment, the output circuit is forcibly turned off based on the detection result of the overcurrent detection circuit, and then caused to return to the normal operation based on the cancellation signal that is outputted after the off period TGF, which is determined by the control unit CPU, passes.

By counting, by means of the control unit CPU, the period during which the output circuit is suspended when an overcurrent is caused in the output circuit, and processing other processes by means of hardware, the process load of the control unit CPU may be reduced even if the switching frequency is high.

While certain embodiments have been described, these embodiments have been presented by way of example only, and are not intended to limit the scope of the inventions. The embodiments may be embodied in a variety of other forms. Furthermore, various omissions, substitutions and changes in the form of the methods and systems described herein may be made without departing from the spirit of the inventions. The embodiments and their modifications are included in the scope and the subject matter of the Invention, and at the same time Included in the scope of the claimed inventions and their equivalents.

EXPLANATION OF REFERENCES

100: power supply device
OC: output circuit
DC: driving circuit
X: overcurrent detection circuit
Y: off-state fixing circuit
CPU: control unit (microcomputer)
BC: bridge circuit
Tr1: first output transistor
Tr2: second output transistor
Tr3: third output transistor
Tr4: fourth output transistor
R1: first detection resistor R2: second detection resistor
AH1: first high-side logic circuit
AH2: second high-side logic circuit
AL1: first low-side logic circuit
AL2: second low-side logic circuit
DCH: high-side driver
DCL: low-side driver

The invention claimed is:

1. A power supply device, comprising:
an output circuit configured to be supplied with electric power from a power supply, and to output a current;
a driving circuit configured to control an output operation of the output circuit for outputting the current;
an overcurrent detection circuit configured to output a detection signal to a first node when detecting an overcurrent in the output circuit;
an off-state fixing circuit configured to output, based on the detection signal inputted to the first node, an off-state fixing signal for performing a forcible suspension of the output operation of the output circuit from an output node to the driving circuit, regardless of whether a control signal is outputted; and
a control unit configured to receive the detection signal, and to output the control signal for controlling the output operation of the output circuit to the driving circuit for controlling the output operation of the output circuit by means of the driving circuit,
wherein, in response to the off-state fixing signal, the driving circuit performs the forcible suspension of the output operation of the output circuit regardless of whether the control signal is outputted,
wherein the control unit outputs a cancellation signal for cancelling the forcible suspension of the output operation of the output circuit to the off-state fixing circuit after an off period passes from time when the detection signal is inputted,
wherein, in response to the cancellation signal, the off-state fixing circuit stops outputting the off-state fixing signal to cause the driving circuit to return to a normal operation for controlling the output operation of the output circuit based on the control signal,
wherein the off-state fixing circuit:
outputs the detection signal inputted to the first node to the driving circuit as the off-state fixing signal, and thereafter, controls a potential at the first node to stop outputting the off-state fixing signal in response to the cancellation signal inputted,
wherein the overcurrent detection circuit does not output the detection signal to the first node when no overcurrent caused by the output operation of the output circuit is detected,
wherein the control unit outputs the control signal for controlling the output operation of the output circuit to the driving circuit in Carder to control the output operation of the output circuit by means of the driving circuit when the detection signal is not inputted after the cancellation signal is outputted,
wherein the output node is connected to the first node,
wherein the off-state fixing circuit includes:
a first control resistor having an end that is connected to the power supply, and another end that is connected to the first node,
a second control resistor having an end that is connected to the power supply,
a capacitor having an end that is connected to the first node, and another end that is connected to a fixed potential,
a PNP-type bipolar transistor having an emitter that is connected to the first node, another end that is connected to the fixed potential, and a base that is connected to another end of the second control resistor, and
an NPN-type bipolar transistor having a collector that is connected to the other end of the second control resistor, an emitter that is connected to the fixed potential, and a base to which the cancellation signal from the control unit is inputted, and
wherein the off-state fixing circuit outputs a signal that is based on the potential at the first node to the driving circuit as the off-state fixing signal, in response to the detection signal outputted from the overcurrent detection circuit, and stops outputting the off-state fixing signal to the driving circuit in response to the cancellation signal outputted from the control unit.

2. The power supply device according to claim 1, wherein the control unit:
makes a feedback of the cancellation signal that is outputted, and detects whether there is an abnormal condition in the cancellation signal in the feedback; and
controls the driving circuit by means of the control signal to stop the output operation of the output circuit when detecting the abnormal condition in the cancellation signal.

3. The power supply device according to claim 1, where the driving circuit includes:
a logic circuit configured to output a logic signal obtained by performing calculation of the control signal and a signal that is based on a potential at the first node; and
a driver configured to control, based on the logic signal, the output operation for outputting the current from the output circuit.

4. The power supply device according to claim 1, wherein the output circuit is a bridge circuit configured to control and output the electic power supplied from the power supply.

5. The power supply device according to claim 4, wherein the bridge circuit includes:
a first output transistor having an end that is connected to the power supply, and another end that is connected to a first output terminal;
a second output transistor having an end that is connected to the power supply, and another end that is connected to a second output terminal;
a third output transistor having an end that is connected to the first output terminal, and another end that is connected to a fixed potential;
a fourth output transistor having an end that is connected to the second output terminal, and another end that is connected to the fixed potential;
a first detection resistor having an end that is connected to the other end of the third output transistor, and another end that is connected to the fixed potential; and
a second detection resistor having an end that is connected to the other end of the fourth output transistor, and another end that is connected to the fixed potential,
wherein the overcurrent detection circuit detects currents flowing through the first detection resisted anti the second detection resistor to detect the overcurrent of a current outputted from the bridge circuit, and outputs the detection signal depending on a detection result, and
wherein the driving circuit controls an output operation of the bridge circuit to output electric power by controlling operations of the first to fourth output transistors based on the control signal during the normal operation.

6. The power supply device according to claim 5, wherein the driving circuit:
   performs suspension of the operations of the first to fourth output transistors in response to the off-state fixing signal outputted from the off-state fixing circuit based on the detection signal at the first node when the overcurrent is detected by the overcurrent detection circuit;
   then, cancels the suspension of the operations of the first to fourth output transistors when the output of the off-state fixing signal based on the cancellation signal from the off-state fixing circuit is stopped; and
   then, controls the operations of the first to fourth output transistors based on the control signal.

7. The power supply device according to claim 1, wherein the control unit sets the off period, during which the output operation of the output circuit is forcibly suspended, by means of software.

8. The power supply device according to claim 1, wherein the output node is connected to the first node, wherein the off-state fixing circuit includes:
   a first PNP-type bipolar transistor having an emitter that is connected to the power supply;
   a first control resistor having an end that is connected to a collector of the first PNP-type bipolar transistor;
   a first NPN-type bipolar transistor having a collector that is connected to another end of the first control resistor, an emitter that is connected to a fixed potential, and a base, to which the cancellation signal is inputted from the control unit;
   a second control resistor having an end that is connected to the power supply, and another end that is connected to a base of the first PNP-type bipolar transistor;
   a third control resistor having an end that is connected to the other end of the second control resistor, and another end that is connected to the first node; and
   a second NPN-type bipolar transistor having a collector that is connected to the other end of the third control resistor, an emitter that is connected to the fixed potential, and a base that is connected to the other end of the first control resistor, and
   wherein the off-state fixing circuit outputs a signal that is based on the potential at the first node to the driving circuit as the off-state fixing signal in response to the detection signal outputted from the overcurrent detection circuit, and stops outputting the off-state fixing signal to the driving circuit in response to the cancellation signal outputted from the control unit.

9. The power supply device according to claim 1, wherein the overcurrent detection circuit outputs the detection signal when the current outputted from the output circuit is equal to or greater than an overcurrent threshold value that is predefined, and does not output the detection signal when the current outputted from the output circuit is less than the overcurrent threshold value.

10. A power supply device, comprising:
   an output circuit configured to be supplied with electric power from a power supply, and to output a current;
   a driving circuit configured to control an output operation of the output circuit for outputting the current;
   an overcurrent detection circuit configured to output a detection signal to a first node when detecting an overcurrent in the output circuit;
   an off-state fixing circuit configured to output, based on the detection signal inputted to the first node, an off-state fixing signal for performing a forcible suspension of the output operation of the output circuit from an output node to the driving circuit, regardless of whether a control signal is outputted; and
   a control unit configured to receive the detection signal, and to output the control signal for controlling the output operation of the output circuit to the driving circuit for controlling the output operation of the output circuit by means of the driving circuit,
   wherein, in response to the off-state fixing signal, the driving circuit performs the forcible suspension of the output operation of the output circuit regardless of whether the control signal is outputted,
   wherein the control unit outputs a cancellation signal for cancelling the forcible suspension of the output operation of the output circuit to the off-state fixing circuit after an off period passes from time when the detection signal is inputted,
   wherein, in response to the cancellation signal, the off-state fixing circuit stops outputting the off-state fixing signal to cause the driving circuit to return to a normal operation for controlling the output operation of the output circuit based on the control signal,
   wherein the off-state fixing circuit:
      outputs the detection signal inputted to the first node to the driving circuit as the off-state fixing signal, and thereafter, controls a potential at the first node to stop outputting the off-state fixing signal response to the cancellation signal inputted,
   wherein the overcurrent detection circuit does not output the detection signal to the first node when no overcurrent caused by the output operation of the output circuit is detected,
   wherein the control unit outputs the control signal for controlling the output operation of the output circuit to the driving circuit in order to control the output operation of the output circuit by means of the driving circuit when the detection signal is not inputted after the cancellation signal is outputted,
   wherein the off-state fixing circuit includes:
      a first control resistor having an end that is connected to the power supply, and another end that is connected to the output node,
      a second control resistor having an end that is connected to the power supply,
      a third control resistor having an end that is connected to another end of the second control resistor, and another end that is connected to the first node,
      a first capacitor having an end that is connected to the other end of the first control resistor, and another end that is connected to a fixed potential,
      a second capacitor having an end that is connected to the end of the second control resistor, and another end that is connected to the fixed potential,
      a third capacitor having an end that is connected to the other end of the second control resistor, and another end that is connected to the fixed potential,
      a fourth control resistor having an end that is connected to the other end of the second control resistor,
      an NPN-type bipolar transistor having a collector that is connected to the other end of the second capacitor, an emitter that is connected to the fixed potential, and a base to which the cancellation signal from the control unit is inputted, and a reset circuit having an end that is connected to the other end of the first control resistor, and another end that is connected to the fixed potential, the reset circuit being configured to electrically connect the end and the other end of the first capacitor to discharge the first capacitor when a potential at the other end of the second control resistor is less than a reset threshold value that is predefined, and to electrically disconnect the end and the other end of the first capacitor when the potential at the other end of the second control resistor is equal to or greater than the reset threshold value, and wherein the off-state fixing circuit outputs a signal that is based on the potential at the fiat node to the driving circuit as the off-state fixing signal in response to the detection signal outputted from the overcurrent detection circuit, and stops outputting the off-state fixing signal to the driving circuit in response to the cancellation signal outputted from the control unit.

11. A method of controlling a power supply device including:
an output circuit configured to be supplied with electric power from a power supply, and to output a current; a driving circuit configured to control an output operation of the output circuit for outputting the current; an overcurrent detection circuit configured to output a detection signal to a first node when detecting an overcurrent in the output circuit; an off-state fixing circuit configured to output, based on the detection signal inputted to the first node, an off-state fixing signal for performing a forcible suspension of the output operation of the output circuit from an output node to the driving circuit, regardless of whether a control signal is outputted; and a control unit configured to receive the detection signal, and to output the control signal for controlling the output operation of the output circuit to the driving circuit for controlling the output operation of the output circuit by means of the driving circuit, the method comprising the steps of:
performing a forcible suspension of the output operation of the output circuit in response to the off-state fixing signal by means of the driving circuit, regardless of whether the control signal is outputted;
outputting, from the control unit, a cancellation signal for cancelling the forcible suspension of the output operation of the output circuit to the off-state fixing circuit after an off period passes from time when the detection signal is inputted; and in response to the cancellation signal, stopping, by the off-state fixing circuit, outputting the off-state fixing signal to cause the driving circuit to return to a normal operation for controlling the output operation of the output circuit based on the control signal, wherein the off state fixing circuit:
outputs the detection signal inputted to the first node to the driving circuit as the off-state fixing signal; and
thereafter, controls a potential at the first node to stop outputting the off-state fixing signal in response to the cancellation signal inputted, wherein the overcurrent detection circuit does not output the detection signal to the first node when no overcurrent caused by the output operation of the output circuit is detected, wherein the control unit outputs the control signal for controlling the output operation of the output circuit to the driving circuit in order to control the output operation of the output circuit by means of the driving circuit when the detection signal is not inputted after the cancellation signal is outputted, wherein the output node is connected to the first node, wherein the off-state fixing circuit includes:
a first control resistor having an end that is connected to the power supply, and another end that is connected to the first node,
a second control resistor having an end that is connected to the power supply,
a capacitor having an end that is connected to the first node, and another end that is connected to a fixed potential,
a PNP-type bipolar transistor having an emitter that is connected to the first node, another end that is connected to the fixed potential, and a base that is connected to another end of the second control resistor, and
an NPN-type bipolar transistor having a collector that is connected to the other end of the second control resistor, an emitter that is connected to the fixed potential, and a base to which the cancellation signal from the control unit is inputted, and wherein the off-state fixing circuit outputs a signal that is based on the potential at the first node to the driving circuit as the off-state fixing signal, in response to the detection signal outputted from the overcurrent detection circuit and stops outputting the off-state fixing signal to the driving circuit in response to the cancellation signal outputted from the control unit.

* * * * *